United States Patent
Irie

(12) 
(10) Patent No.: US 6,966,710 B2
(45) Date of Patent: Nov. 22, 2005

(54) PATTERN FORMING METHOD AND APPARATUS FOR FABRICATING SEMICONDUCTOR DEVICE

(75) Inventor: Shigeo Irie, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/847,301

(22) Filed: May 18, 2004

(65) Prior Publication Data

US 2004/0213563 A1      Oct. 28, 2004

Related U.S. Application Data

(62) Division of application No. 09/891,192, filed on Jun. 26, 2001, now Pat. No. 6,855,485.

(30) Foreign Application Priority Data

Jun. 27, 2000 (JP) .............................. 2000-192459

(51) Int. Cl.[7] .......................... G03D 5/00; G03B 27/32; G03B 27/54
(52) U.S. Cl. .............................. 396/611; 355/27; 355/67
(58) Field of Search .......................... 396/611; 355/27, 355/30, 53, 67; 430/313, 317, 325, 330; 378/34

(56) References Cited

U.S. PATENT DOCUMENTS

| 4,764,247 A | 8/1988 | Leveriza et al. |
| 6,074,804 A | 6/2000 | Endo et al. |
| 6,245,491 B1 | 6/2001 | Shi |
| 6,368,776 B1 | 4/2002 | Harada et al. |
| 6,449,332 B1 * | 9/2002 | Chiba .......................... 378/34 |
| 6,897,455 B2 * | 5/2005 | Lin .......................... 250/492.2 |

FOREIGN PATENT DOCUMENTS

| JP | 5-206020 | 8/1993 |
| JP | 2000-131854 A | 5/2000 |

OTHER PUBLICATIONS www.lamrc.com, TCP© 9400DFM-Silicon Etch, Jul. 24, 2003, Lam RESEARCH©, 3 pgs.

* cited by examiner

*Primary Examiner*—Alan Mathews
(74) *Attorney, Agent, or Firm*—McDermott Will & Emery LLP

(57) ABSTRACT

A resist film is formed out of a resist material on a substrate, and then pre-baked. Next, the pre-baked resist film is exposed to extreme ultraviolet radiation through a photomask. Then, the exposed resist film is developed, thereby defining a resist pattern on the substrate. The pre-baking and exposing steps are carried out in a vacuum without subjecting the resist film to the air.

11 Claims, 8 Drawing Sheets

PATTERN FORMING METHOD AND APPARATUS FOR FABRICATING SEMICONDUCTOR DEVICE

This application is a divisional of application Ser. No. 09/891,192 filed Jun. 26, 2001 now U.S. Pat. No. 6,855,485.

BACKGROUND OF THE INVENTION

The present invention relates to a method for forming a fine-line resist pattern by exposing a resist film to extreme ultraviolet (EUV) radiation through a photomask and also relates to an apparatus for fabricating a semiconductor device by utilizing the pattern forming method.

As semiconductor devices for a semiconductor integrated circuit have been downsized, it has become increasingly necessary to further reduce the feature size of a line-and-space pattern. And to define a fine-line pattern, a lithography technique is indispensable. Particularly when a pattern with a line width of 0.07 μm or less should be defined, a lithography technique using EUV radiation with a wavelength of around 13 nm as an exposing radiation is expected to be very effective.

In a known lithographic process using krypton fluoride (KrF) excimer laser radiation (with a wavelength of around 248 nm) or argon fluoride (ArF) excimer laser radiation (with a wavelength of around 193 nm), an exposure process is carried out in the air or nitrogen ambient. However, if the same exposure process is performed in such an ambient using EUV radiation, then the radiation is absorbed into oxygen or nitrogen molecules contained in the ambient, because the EUV radiation has a much shorter wavelength. This is why the EUV exposure process should be carried-out in a vacuum.

For that reason, a known process of forming a resist pattern out of a chemically amplified resist material, for example, using the EUV radiation is carried out in the following manner.

First, a chemically amplified resist material is applied onto a substrate in the air to deposit a resist film thereon. Next, the resist film is pre-baked to vaporize a solvent contained in the resist film.

Then, the resist film is exposed through a photomask to EUV radiation in a vacuum, thereby transferring the pattern of the photomask onto the resist film.

Subsequently, the resist film is subjected to a post-exposure baking process in the air so that the acid diffuses in the exposed or non-exposed parts of the resist film. Finally, the resist film is developed using a developer, thereby defining a resist pattern.

Where a resist pattern should be formed out of a non-chemically-amplified resist material, the resist film is exposed through a photomask to EUV radiation in a vacuum and then developed immediately in the air without being subjected to the post-exposure baking process.

The present inventor tentatively defined a resist pattern by exposing a resist film to EUV radiation and then patterned a film on a substrate by dry-etching it using the resist pattern obtained. As a result, the present inventor found that the walls of the patterned film showed a non-negligibly high degree of roughness.

SUMMARY OF THE INVENTION

An object of this invention is reducing the roughness at the walls of a patterned film to a negligible degree where the patterned film is obtained by dry-etching an original film using, as a mask, a resist pattern defined through exposure of a resist film to EUV radiation.

The present inventor carried out intensive research to understand why the walls of a patterned film showed an increased degree of roughness where the patterned film had been formed by dry-etching an original film using, as a mask, a resist pattern defined through exposure of a resist film to EUV radiation. As a result, the present inventor found the following.

Firstly, in an EUV exposure process, a resist film is exposed to EUV radiation with as high an energy as about 100 eV in a vacuum, thus degassing the resist film. A gas (e.g., $CO_2$ gas), given off from the resist film, produces some reactants (e.g., $CO_x$ (where x<2)), which soon deposit themselves on the walls of a resultant resist pattern to increase the roughness at the walls of the resist pattern. For that reason, the walls of the film patterned would also increase their roughness because the roughened pattern is transferred as it is onto the film.

Also, where a patterned film is formed by plasma-etching an original film using the resist pattern, a gas (e.g., $CO_2$ gas) emanated from the resist film mixes with the plasma generated in a chamber. Accordingly, the chemical composition of the plasma is subject to change during the plasma etching process, thus eventually increasing the roughness at the walls of the patterned film.

Furthermore, where a resist film is formed out of a chemically amplified resist material, the resist film is pre-baked in the air and then transported to the vacuum chamber of an exposure apparatus as described above. However, during this transportation, the surface of the resist film might be affected by an alkaline substance such as ammonia to possibly form an insoluble layer, which is hard to dissolve in an alkaline developer, on the surface. In that case, it is very difficult to form a fine-line resist pattern as intended.

The present inventor acquired the basic idea of this invention from these findings.

Specifically, a first inventive pattern forming method includes the steps of: a) forming a resist film out of a resist material on a substrate; b) pre-baking the resist film; c) exposing the pre-baked resist film to extreme ultraviolet radiation through a photomask; and d) developing the exposed resist film, thereby defining a resist pattern on the substrate. In this method, the steps b) and c) are carried out in a vacuum without subjecting the resist film to the air.

A second inventive pattern forming method includes the steps of: a) forming a resist film out of a resist material on a substrate in a first processing chamber filled with the air or an inert gas; b) pre-baking the resist film in a second processing chamber filled with a vacuum; c) transporting the pre-baked resist film in line to a third processing chamber filled with a vacuum and then exposing the pre-baked resist film to extreme ultraviolet radiation through a photomask in the third processing chamber; and d) transporting the exposed resist film in line to the first processing chamber and then developing the exposed resist film in the first processing chamber, thereby defining a resist pattern on the substrate.

In the first and second pattern forming methods, the pre-baking step b) is carried out in a vacuum, not in the air unlike the known process, so a gas like $CO_2$ gas is given off from the resist film in this pre-baking step b). Accordingly, even if the resist film is exposed to high-energy EUV radiation in a vacuum after that, the degassing phenomenon rarely occurs in that exposing step c). That is to say, in this exposing step c), the reactants, usually produced by the $CO_2$ gas, etc., emanated from the resist film during the exposure, will not deposit themselves on the walls of the resultant resist pattern. This is because the gas has already been released in the previous step b). Thus, those walls of the resist pattern much less likely increase their roughness. As a result, the walls of the patterned film will not increase their roughness, either.

Particularly, according to the second method, the pre-baking and exposing steps b) and c) are performed in mutually different processing chambers. In addition, a much smaller quantity of gas is released in the exposing step c). Accordingly, almost no reactants will deposit themselves on the surface of the resist film, photomask or optical system including mirrors. Consequently, the resist pattern will not be deformed or the EUV radiation exposure dose will not decrease.

A third inventive pattern forming method includes the steps of: a) forming a resist film out of a chemically amplified resist material on a substrate; b) pre-baking the resist film; c) exposing the pre-baked resist film to extreme ultraviolet radiation through a photomask; d) post-baking the exposed resist film; and e) developing the post-baked resist film, thereby defining a resist pattern on the substrate. In this method, the steps b), c) and d) are carried out in a vacuum without subjecting the resist film to the air.

A fourth inventive pattern forming method includes the steps of: a) forming a resist film out of a chemically amplified resist material on a substrate in a first processing chamber filled with the air or an inert gas; b) pre-baking the resist film in a second processing chamber filled with a vacuum; c) transporting the pre-baked resist film in line to a third processing chamber filled with a vacuum and then exposing the pre-baked resist film to extreme ultraviolet radiation through a photomask in the third processing chamber; d) transporting the exposed resist film in line to the second processing chamber and then post-baking the exposed resist film in the second processing chamber; and e) transporting the post-baked resist film in line to the first processing chamber and then developing the post-baked resist film in the first processing chamber, thereby defining a resist pattern on the substrate.

In the third and fourth pattern forming methods, the pre-baking step b) is carried out in a vacuum, not in the air unlike the known process, so a gas like $CO_2$ gas is given off from the resist film in this pre-baking step b). Accordingly, even if the resist film is exposed to high-energy EUV radiation in a vacuum after that, the degassing phenomenon rarely occurs in that exposing step c). That is to say, in this exposing step c), the reactants, usually produced by the $CO_2$ gas, etc., emanated from the resist film during the exposure, will not deposit themselves on the walls of the resultant resist pattern. This is because the gas has already been released in the previous step b). Thus, those walls of the resist pattern much less likely increase their roughness. As a result, the walls of the patterned film will not increase their roughness, either.

In addition, the post-baking step d) is also performed in a vacuum, so the gas like $CO_2$ gas emanates again from the resist film at this post-baking step d). Accordingly, where a patterned film is formed by etching an original film with a plasma, the gas released from the resist film will not mix with the plasma generated in a chamber. This is because the post-baking and plasma etching process steps are carried out in mutually different (i.e., the second and first) chambers. For that reason, the chemical composition of the plasma will not change during the plasma etching process, so the walls of the patterned film will not increase their roughness.

Furthermore, the pre-baking, exposing and post-baking steps b), c) and d) are performed in a vacuum without subjecting the resist film to the air. Thus, the resist film, made of a chemically amplified resist material, is not affected by an alkaline substance like ammonia contained in the air, and no insoluble layer, difficult to dissolve in an alkaline developer, is formed on the surface of the resist film. Consequently, a fine-line resist pattern can be formed just as intended.

Particularly, according to the fourth method, the pre- and post-baking steps b) and d) are performed in a chamber different from the chamber in which the exposing step c) is performed. In addition, a much smaller quantity of gas is released in the exposing step c). Accordingly, almost no reactants will deposit themselves on the surface of the resist film, photomask or optical system including mirrors. Consequently, the resist patter will not be deformed or the EUV radiation exposure dose will not decrease.

A fifth inventive pattern forming method includes the steps of: a) forming a resist film out of a chemically amplified resist material on a substrate; b) pre-baking the resist film; c) exposing the pre-baked resist film to extreme ultraviolet radiation through a photomask; d) post-baking the exposed resist film; e) forming a silylated layer selectively on the surface of the post-baked resist film; and f) dry-developing the resist film, on which the silylated layer has been formed, using the silylated layer as a hard mask, thereby defining a resist pattern on the substrate. In this method, the steps b), c), d), e) and f) are carried out in a vacuum without subjecting the resist film to the air.

A sixth inventive pattern forming method includes the steps of: a) forming a resist film out of a photoresist material on a substrate in a first processing chamber filled with the air or an inert gas; b) pre-baking the resist film in a second processing chamber filled with a vacuum; c) transporting the pre-baked resist film in line to a third processing chamber filled with a vacuum and then exposing the pre-baked resist film to extreme ultraviolet radiation through a photomask in the third processing chamber; d) transporting the exposed resist film in line to the second processing chamber and then post-baking the exposed resist film in the second processing chamber; e) transporting the post-baked resist film in line to a fourth processing chamber filled with a vacuum and then forming a silylated layer selectively on the surface of the post-baked resist film in the fourth processing chamber; and f) transporting the resist film, on which the silylated layer has been formed, in line to a fifth processing chamber filled with a vacuum and then dry-developing the resist film, having the silylated layer thereon, using the silylated layer as a hard mask in the fifth processing chamber, thereby defining a resist pattern on the substrate.

In the fifth and sixth pattern forming methods, the pre-baking step b) is carried out in a vacuum, not in the air unlike the known process, so a gas like $CO_2$ gas is given off from the resist film in this pre-baking step b). Accordingly, even if the resist film is exposed to high-energy EUV radiation in a vacuum after that, the degassing phenomenon rarely occurs in that exposing step c). That is to say, in this exposing step c), the reactants, usually produced by the $CO_2$ gas, etc., emanated from the resist film during the exposure, will not deposit themselves on the walls of the resultant resist pattern, because the gas has already been released in the previous step b). Thus, those walls of the resist pattern much less likely increase their roughness. As a result, the walls of the patterned film will not increase their roughness, either.

In addition, the post-baking step d) is also performed in a vacuum, so the gas like $CO_2$ gas emanates again from the resist film at this post-baking step d). Accordingly, when the resist film is dry-developed (i.e., plasma-etched) using a silylated layer as a hard mask or when a patterned film is formed by etching an original film with a plasma, the gas released from the resist film will not mix with the plasma generated in the chamber. For that reason, the chemical composition of the plasma will not change during the plasma etching process.

Furthermore, the pre-baking, exposing, post-baking and silylating steps b), c), d) and e) are performed in a vacuum without subjecting the resist film to the air. Thus, the resist film, made of a chemically amplified resist material, is not affected by an alkaline substance like ammonia contained in the air, and no insoluble layer, difficult to dissolve in an alkaline developer, is formed on the surface of the resist film. Consequently, a good silylated layer can be formed on the surface of the resist film and a fine-line resist pattern can be defined just as intended.

Particularly, according to the sixth method, the pre- and post-baking steps b) and d) are performed in a chamber different from any of the chambers in which the exposing, silylating and dry-developing steps c), e) and f) are performed. In addition, a much smaller quantity of gas is released in the exposing step c). Accordingly, almost no reactants will deposit themselves on the surface of the resist film, photomask or optical system including mirrors. Consequently, the resist pattern will not be deformed or the EUV radiation exposure dose will not decrease.

As described above, according to the first through sixth inventive pattern forming methods, a gas like $CO_2$ gas is given off from the resist film in the pre-baking step b). Thus, even if the resist film is exposed to high-energy EUV radiation in a vacuum after that, the degassing phenomenon rarely occurs in that exposing step c). That is to say, in this exposing step c), the reactants, usually produced by the gas emanated from the resist film during the exposure, will not deposit themselves on the walls of the resultant resist pattern. As a result, the resist pattern can have the very cross-sectional shape originally designed.

In one embodiment of the present invention, the pre-baking step b) preferably includes heating the resist film while irradiating the resist film with a type of radiation having too long a wavelength to sensitize the resist film.

Then, an even greater quantity of gas is released from the resist film in the pre-baking step b), thus increasing the throughput of the gas released and further suppressing the degassing phenomenon in the exposing step.

A first inventive apparatus for fabricating a semiconductor device includes first, second and third processing chambers. In the first processing chamber, a resist film is formed out of a resist material on a substrate and a resist pattern is defined on the substrate by developing the resist film that has been exposed to extreme ultraviolet radiation. The second processing chamber is filled with a vacuum, and is used to pre-bake the resist film. The third processing chamber is also filled with a vacuum and is used to expose the pre-baked resist film to the extreme ultraviolet radiation through a photomask.

In the first apparatus, the pre-baking step can be carried out in the second processing chamber filled with a vacuum, so a gas like $CO_2$ gas is given off from the resist film in this pre-baking step. Accordingly, even if the resist film is exposed to high-energy EUV radiation in a vacuum after that, the degassing phenomenon rarely occurs in that exposing step. That is to say, in this exposing step, the reactants, usually produced by the $CO_2$ gas, etc., emanated from the resist film during the exposure, will not deposit themselves on the walls of the resultant resist pattern. This is because the gas has already been released in the previous pre-baking step. Thus, those walls of the resist pattern much less likely increase their roughness. As a result, the walls of the patterned film will not increase their roughness, either.

In addition, the pre-baking and exposing steps are performed in mutually different processing chambers. Moreover, a much smaller quantity of gas is released in the exposing step. Accordingly, almost no reactants will deposit themselves on the surface of the resist film, photomask or optical system including mirrors. Consequently, the resist pattern will not be deformed or the EUV radiation exposure dose will not decrease.

A second inventive apparatus for fabricating a semiconductor device also includes first, second and third processing chambers. In the first processing chamber, a resist film is formed out of a chemically amplified resist material on a substrate and a resist pattern is defined on the substrate by developing the resist film that has been exposed to extreme ultraviolet radiation. The second processing chamber is filled with a vacuum and is used to pre- and post-bake the resist film before and after the resist film is exposed to the extreme ultraviolet radiation, respectively. The third processing chamber is also filled with a vacuum and is used to expose the pre-baked resist film to the extreme ultraviolet radiation through a photomask.

In the second apparatus, the pre-baking step can be carried out in the second processing chamber filled with a vacuum, so a gas like $CO_2$ gas is given off from the resist film in this pre-baking step. Accordingly, even if the resist film is exposed to high-energy EUV radiation in a vacuum after that, the degassing phenomenon rarely occurs in that exposing step. That is to say, in this exposing step, the reactants, usually produced by the $CO_2$ gas, etc., emanated from the resist film during the exposure, will not deposit themselves on the walls of the resultant resist pattern. This is because the gas has already been released in the previous pre-baking step. Thus, those walls of the resist pattern much less likely increase their roughness. As a result, the walls of the patterned film will not increase their roughness, either.

In addition, the pre- and post-baking steps are performed in a chamber different from a chamber in which the exposing step is performed. Moreover, a much smaller quantity of gas is released in the exposing step. Accordingly, almost no reactants will deposit themselves on the surface of the resist film, photomask or optical system including mirrors. Consequently, the resist pattern will not be deformed or the EUV radiation exposure dose will not decrease.

Furthermore, the pre-baking, exposing and post-baking steps are performed in a vacuum without subjecting the resist film to the air. Thus, the resist film, made of a chemically amplified resist material, is not affected by an alkaline substance like ammonia contained in the air, and no insoluble layer, difficult to dissolve in an alkaline developer, is formed on the surface of the resist film. Consequently, a fine-line resist pattern can be formed just as intended.

A third inventive apparatus for fabricating a semiconductor device includes first, second, third, fourth and fifth processing chambers. In the first processing chamber, a resist film is formed out of a chemically amplified resist material on a substrate. The second processing chamber is filled with a vacuum and is used to pre- and post-bake the resist film before and after the resist film is exposed to extreme ultraviolet radiation, respectively. The third processing chamber is also filled with a vacuum and is used to expose the pre-baked resist film to the extreme ultraviolet radiation through a photomask. In the fourth processing chamber, a silylated layer is formed selectively on the surface of the post-baked resist film. And in the fifth processing chamber, a resist pattern is defined on the substrate by dry-developing the resist film, on which the silylated layer has been formed, using the silylated layer as a hard mask.

In the third apparatus, the pre-baking step can be carried out in the second processing chamber filled with a vacuum, so a gas like $CO_2$ gas is given off from the resist film in this pre-baking step. Accordingly, even if the resist film is exposed to high-energy EUV radiation in a vacuum after that, the degassing phenomenon rarely occurs in that exposing step. That is to say, in this exposing step, the reactants, usually produced by the $CO_2$ gas, etc., emanated from the resist film during the exposure, will not deposit themselves on the walls of the resultant resist pattern. This is because the gas has already been released in the previous pre-baking step. Thus, those walls of the resist pattern much less likely increase their roughness. As a result, the walls of the patterned film will not increase their roughness, either.

In addition, the pre- and post-baking steps are performed in a chamber different from a chamber in which the exposing step is performed. Moreover, a much smaller quantity of gas is released in the exposing step. Accordingly, almost no reactants will deposit themselves on the surface of the resist film, photomask or optical system including mirrors. Consequently, the resist pattern will not be deformed or the EUV radiation exposure dose will not decrease.

Furthermore, the pre-baking, exposing, post-baking and silylating steps are performed in a vacuum without subjecting the resist film to the air. Thus, the resist film, made of a chemically amplified resist material, is not affected by an alkaline substance like ammonia contained in the air, and no insoluble layer, difficult to dissolve in an alkaline developer, is formed on the surface of the resist film. In addition, the acid can diffuse sufficiently in the pre-baking step, so the contact between exposed and non-exposed portions improves. Accordingly, a good silylated layer can be formed on the surface of the resist film. Consequently, a fine-line resist pattern can be formed accurately enough.

As described above, the first through third inventive apparatuses can release a gas like $CO_2$ gas from the resist film in the pre-baking step. Accordingly, even if the resist film is exposed to high-energy EUV radiation in a vacuum after that, the degassing phenomenon rarely occurs in that exposing step. That is to say, in this exposing step, the reactants, usually produced by the gas emanated from the resist film during the exposure, will not deposit themselves on the walls of the resultant resist pattern. As a result, the resist pattern can have the very cross-sectional shape originally designed.

In one embodiment of the present invention, the second processing chamber preferably includes means for irradiating the resist film with a type of radiation having too long a wavelength to sensitize the resist film.

Then, an even greater quantity of gas is released from the resist film in the pre-baking step, thus further suppressing the degassing phenomenon in the exposing step.

In another embodiment of the present invention, the second processing chamber preferably includes means for exhausting a gas, emanated from the resist film, out of the second processing chamber.

Then, it is possible to avoid an unwanted situation where the gas, released from the resist film in the pre-baking step, re-produce those harmful reactants that easily deposit themselves on the surface of the resist film.

DESCRIPTION OF THE PREFERRED EMBODIMENTS

Embodiment 1

Hereinafter, a resist pattern forming method according to a first embodiment of the present invention will be described with reference to FIGS. 1A through 1D.

Figure 1A:
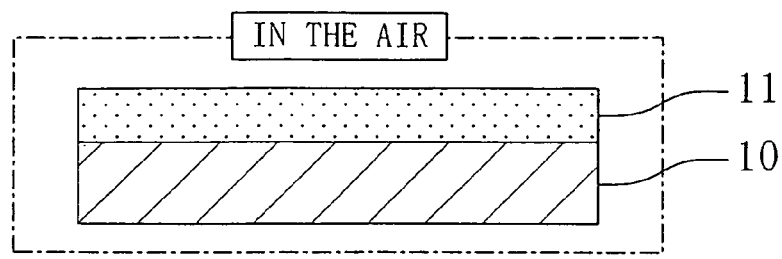
FIGS. 1A through 1D are cross-sectional views illustrating respective process steps for forming a resist pattern according to a first embodiment of the present invention.

First, as shown in FIG. 1A, the surface of a semiconductor substrate 10 is coated with a normal (i.e., non-chemically-amplified) photoresist material using a spin coater, thereby forming a resist film 11 with a thickness of 130 nm, for example.

Figure 1B:
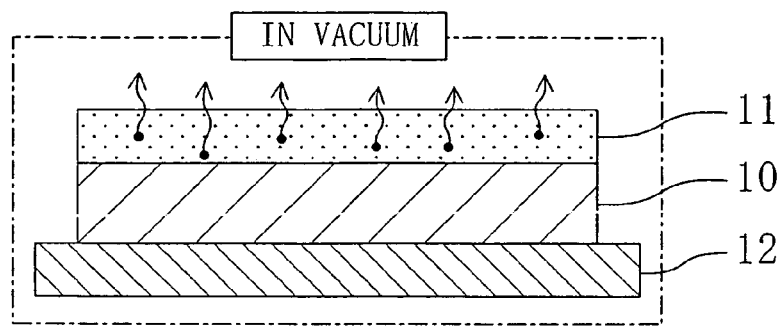

Next, as shown in FIG. 1B, the resist film 11 is pre-baked in a vacuum of about $1.0 \times 10^{-5}$ Pa by getting the substrate 10 heated by a heater 12 to about 90° C. for about 60 seconds, for example. As a result of this pre-baking process step, a solvent vaporizes from the resist film 11 and a gas (e.g., $CO_2$ gas) is released from the resist film 11. If the pre-baked resist film 11 is left in the vacuum for about 300 seconds, then the resist film 11 further gives off the gas like the $CO_2$ gas.

Figure 1C:
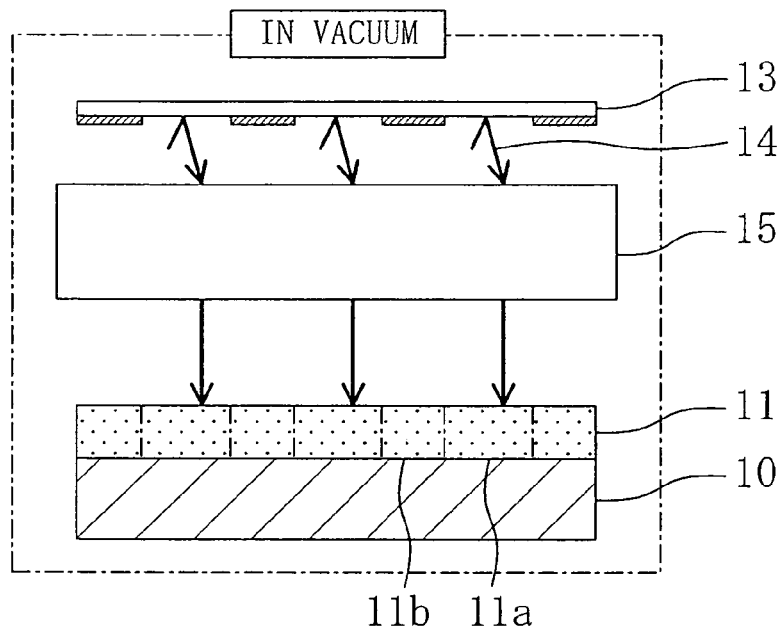

Then, as shown in FIG. 1C, the resist film 11 is exposed to EUV radiation in a vacuum of about $1.0 \times 10^{-6}$ Pa. Specifically, the EUV radiation is emitted from an EUV radiation source (not shown) at a wavelength of around 13 nm, for example, directed toward a reflective mask 13 and then reflected therefrom. Subsequently, the reflected part 14 of the EUV radiation is condensed by a reflection/demagnification optical system 15 to about ⅕, for example, and then allowed to be incident onto the resist film 11. As a result, the resist film 11 comes to have exposed and non-exposed portions 11a and 11b.

In the illustrated embodiment, radiation with a wavelength of around 13 nm is used as the EUV radiation. Alternatively, any other radiation with a wavelength somewhere between 3 and 50 nm may also be used. The reflective mask 13 may be of any type. For example, the reflective mask 13 may include a mask pattern formed on an EUV radiation reflective film. The mask pattern may be made of tantalum, which absorbs EUV radiation, while the EUV radiation reflective film may be a stack of molybdenum and silicon films. The reflection/demagnification optical system 15 may be made up of several reflective mirrors, each having a stack of molybdenum and silicon films as its reflective surface.

Figure 1D:
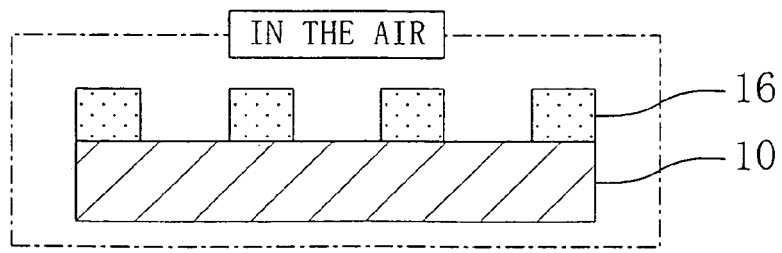

Thereafter, as shown in FIG. 1D, the resist film 11 is subjected to a wet developing process in the air using a developer of xylene, for example, thereby forming a resist pattern 16 on the substrate 10 out of the non-exposed portions 11b of the resist film 11.

In the first embodiment, the pre-baking step is carried out in a vacuum, so a gas like $CO_2$ gas is given off from the resist film 11 in this pre-baking step. Accordingly, even if the resist film 11 is exposed to high-energy EUV radiation in a vacuum after that, the degassing phenomenon rarely occurs in that exposing step. That is to say, in this exposing step, the reactants, usually produced by the $CO_2$ gas, etc., emanated from the resist film 11 during the exposure, will not deposit themselves on the walls of the resultant resist pattern 16. This is because the gas has already been released in the previous step. Thus, those walls of the resist pattern 16 much less likely increase their roughness. Accordingly, when a film to be etched, which has been deposited on the substrate 10, is dry-etched and patterned, the walls of the patterned film will not increase their roughness, either.

Embodiment 2

Hereinafter, a resist pattern forming method according to a second embodiment of the present invention will be described with reference to FIGS. 2A through 2E.

Figure 2A:
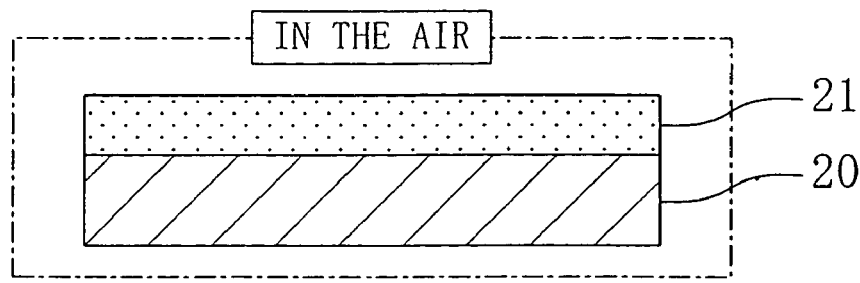
FIGS. 2A through 2E are cross-sectional views illustrating respective process steps for forming a resist pattern according to a second embodiment of the present invention.

First, as shown in FIG. 2A, the surface of a semiconductor substrate 20 is coated with a chemically amplified photoresist material using a spin coater, thereby forming a resist film 21 with a thickness of 130 nm, for example. The chemically amplified photoresist material may be a polyvinyl phenol resin including a protecting group of tertiary butoxy carbonyl (t-BOC).

Figure 2B:
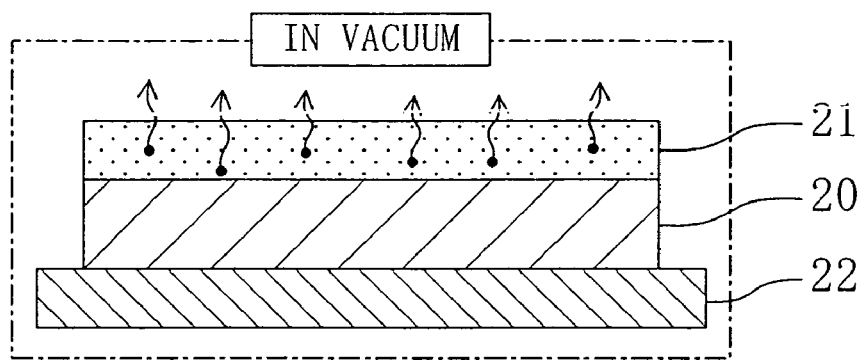

Next, as shown in FIG. 2B, the resist film 21 is pre-baked in a vacuum of about $1.0 \times 10^{-5}$ Pa by getting the substrate 20 heated by a heater 22 to about 110° C. for about 60 seconds, for example. As a result of this pre-baking process step, a solvent vaporizes from the resist film 21 and a gas (e.g., $CO_2$ gas) is given off from the resist film 21. If the pre-baked resist film 21 is left in the vacuum for about 300 seconds, then the resist film 21 further gives off the gas like the $CO_2$ gas.

Figure 2C:
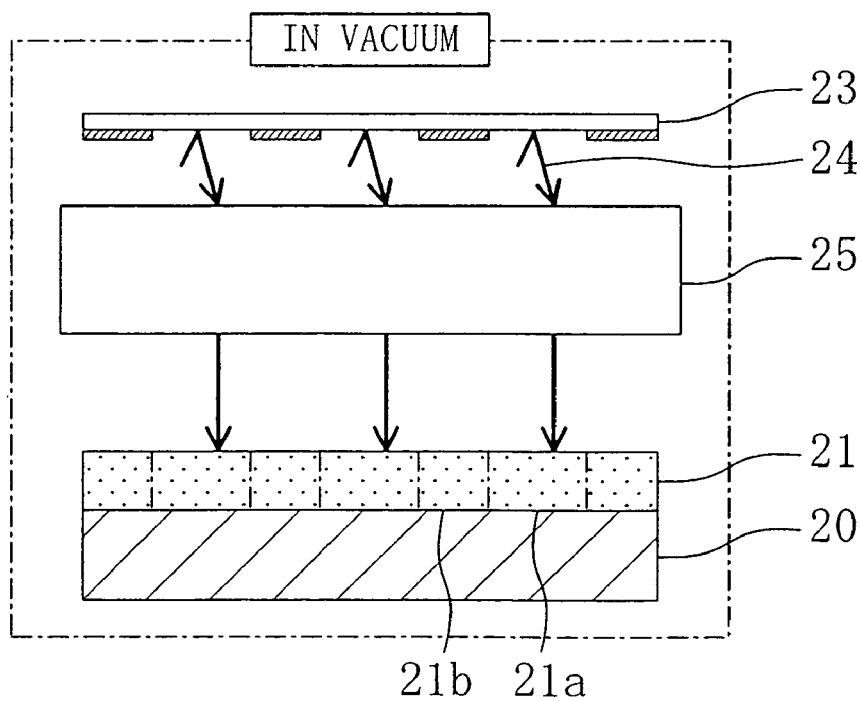

Then, as shown in FIG. 2C, the resist film 21 is exposed to EUV radiation in a vacuum of about $1.0 \times 10^{-6}$ Pa. Specifically, the EUV radiation is emitted from an EUV radiation source (not shown) at a wavelength of around 13 nm, for example, directed toward a reflective mask 23 and then reflected therefrom. Subsequently, the reflected part 24 of the EUV radiation is condensed by a reflection/demagnification optical system 25 to about ⅕, for example, and then allowed to be incident onto the resist film 21. As a result, the resist film 21 comes to have exposed and non-exposed portions 21a and 21b. In the illustrated embodiment, radiation with a wavelength of around 13 nm is used as the EUV radiation. Alternatively, any other radiation with a wavelength somewhere between 3 and 50 nm may also be used. The reflective mask 13 and reflection/demagnification optical system 25 may be the same as those used for the first embodiment.

Figure 2D:
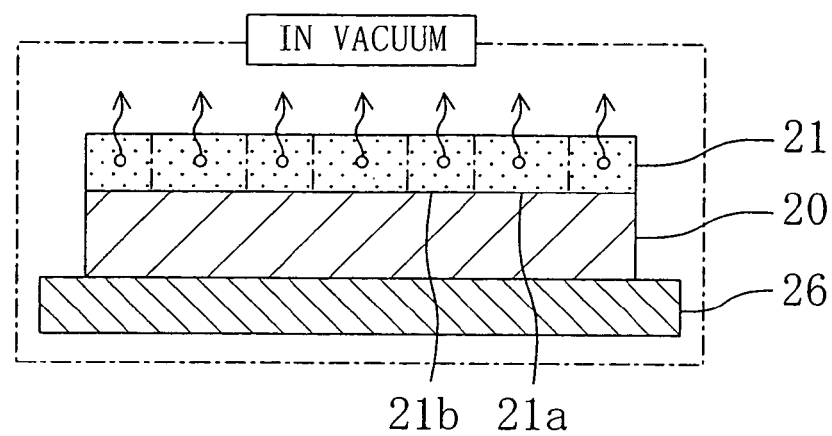

Thereafter, as shown in FIG. 2D, the resist film 21 is post-baked in a vacuum of about $1.0 \times 10^{-5}$ Pa by getting the substrate 20 heated again by a heater 26 to 130° C. for 60 seconds, for example. Then, the acid, which has been generated in the exposed or non-exposed portions 21a or 21b of the resist film 21 as a result of the exposure process, further diffuses and the gas like the $CO_2$ gas further emanates from the resist film 21.

Figure 2E:
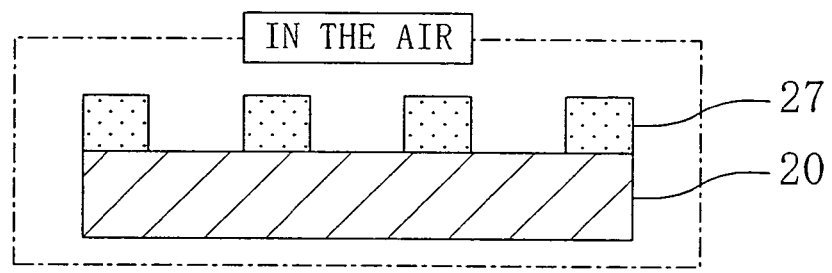

Finally, as shown in FIG. 2E, the resist film 21 is subjected to a wet developing process in the air using a developer of trimethylammonium hydroxide (TMAH), for example, thereby forming a resist pattern 27 on the substrate 20 out of the non-exposed portions 21b of the resist film 21.

In the second embodiment, the pre-baking step is carried out in a vacuum, so a gas like $CO_2$ gas is given off from the resist film 21 in this pre-baking step. Accordingly, even if the resist film 21 is exposed to high-energy EUV radiation in a vacuum after that, the degassing phenomenon rarely occurs in that exposing step. That is to say, in this exposing step, the reactants, usually produced by the $CO_2$ gas, etc., emanated from the resist film 21 during the exposure, will not deposit themselves on the walls of the resultant resist pattern 27. This is because the gas has already been released in the previous step. Thus, those walls of the resist pattern 27 much less likely increase their roughness. Accordingly, when a film to be etched, which has been deposited on the substrate 20, is dry-etched and patterned, the walls of the patterned film will not increase their roughness, either.

In addition, the post-baking step is also performed in a vacuum. Accordingly, where a patterned film is formed by etching an original film with a plasma, the gas released from the resist film 21 will not mix with the plasma generated in the chamber. For that reason, the chemical composition of the plasma will not change during the plasma etching process, so the walls of the patterned film will not increase their roughness.

Embodiment 3

Hereinafter, a resist pattern forming method according to a third embodiment of the present invention will be described with reference to FIGS. 3A through 3F.

Figure 3A:
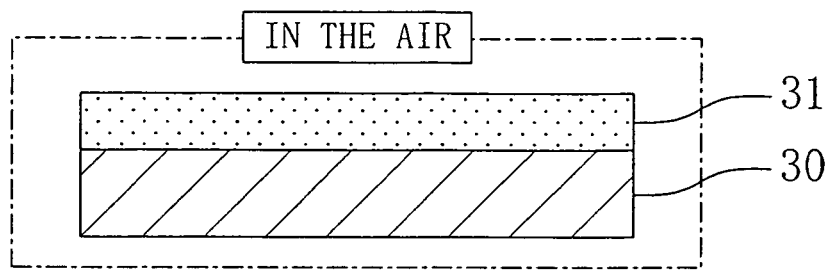
FIGS. 3A through 3F are cross-sectional views illustrating respective process steps for forming a resist pattern according to a third embodiment of the present invention.

First, as shown in FIG. 3A, the surface of a semiconductor substrate 30 is coated with a chemically amplified photoresist material using a spin coater, thereby forming a resist film 31 with a thickness of 130 nm, for example.

Figure 3B:
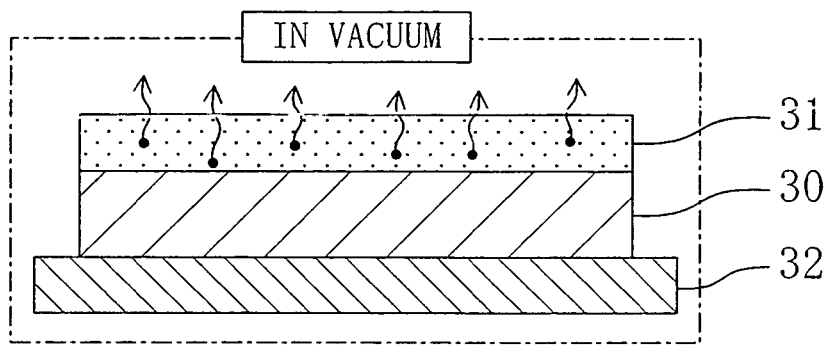

Next, as shown in FIG. 3B, the resist film 31 is pre-baked in a vacuum of about $1.0 \times 10^{-5}$ Pa by getting the substrate 30 heated by a heater 32 to about 110° C. for about 60 seconds, for example. As a result of this pre-baking process step, a solvent vaporizes from the resist film 31 and a gas (e.g., $CO_2$ gas) is given off from the resist film 31. If the pre-baked resist film 31 is left in the vacuum for about 300 seconds, then the resist film 31 further gives off the gas like the $CO_2$ gas.

Figure 3C:
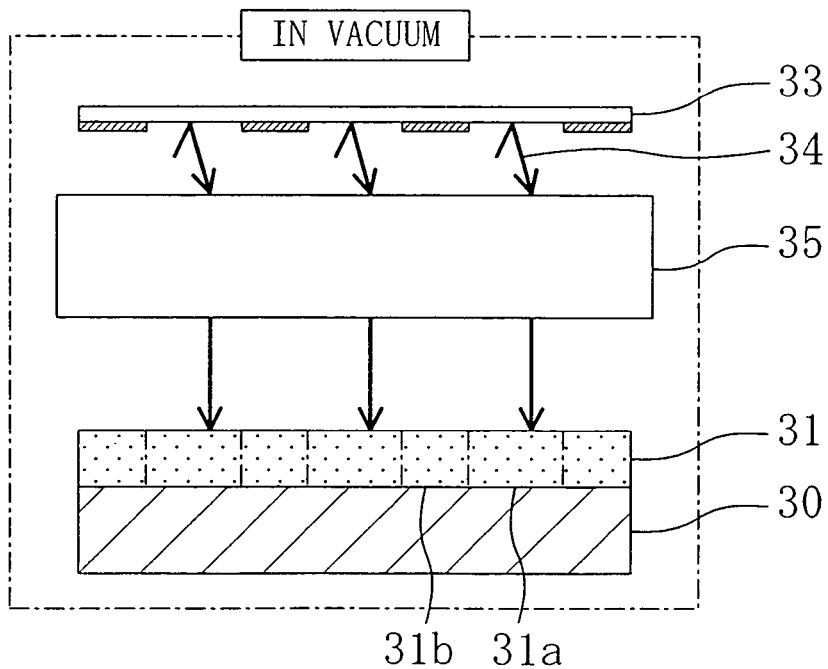

Then, as shown in FIG. 3C, the resist film 31 is exposed to EUV radiation in a vacuum of about $1.0 \times 10^{-6}$ Pa. Specifically, the EUV radiation is emitted from an EUV radiation source (not shown) at a wavelength of around 13 nm, for example, directed toward a reflective mask 33 and then reflected therefrom. Subsequently, the reflected part 34 of the EUV radiation is condensed by a reflection/demagnification optical system 35 to about ⅕, for example, and then allowed to be incident onto the resist film 31. As a result, the resist film 31 comes to have exposed and non-exposed portions 31a and 31b. In the illustrated embodiment, radiation with a wavelength of around 13 nm is used as the EUV radiation. Alternatively, any other radiation with a wavelength somewhere between 3 and 50 nm may also be used. The reflective mask 33 and reflection/demagnification optical system 35 may be the same as those used for the first embodiment.

Figure 3D:
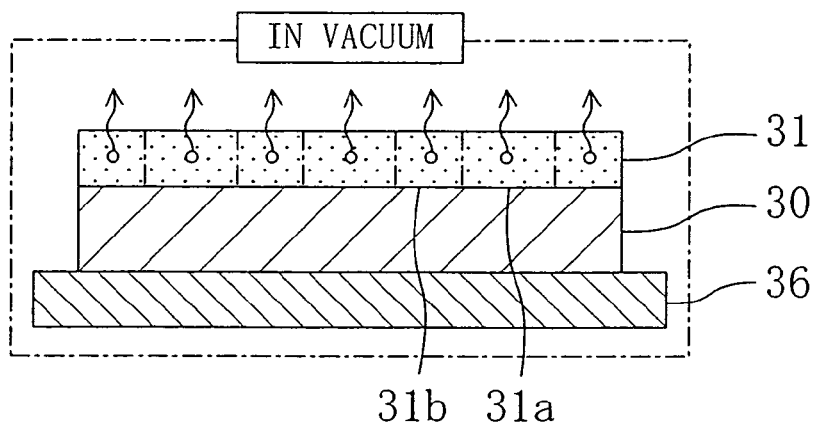

Thereafter, as shown in FIG. 3D, the resist film 31 is post-baked in a vacuum of about $1.0 \times 10^{-5}$ Pa by getting the substrate 30 heated again by a heater 36 to 130° C. for 60 seconds, for example. Then, the acid, which has been generated in the exposed or non-exposed portions 31a or 31b of the resist film 31 as a result of the exposure process, further diffuses and the gas like the $CO_2$ gas further emanates from the resist film 31.

Figure 3E:
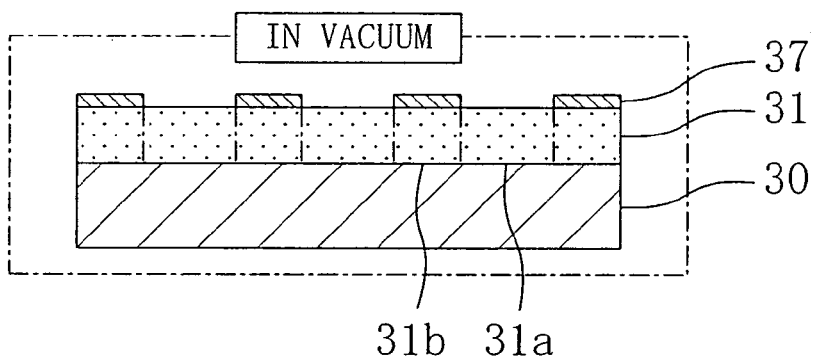

Next, a silylating agent is supplied onto the surface of the resist film 31, thereby forming a silylated layer 37 selectively on the exposed or non-exposed portions 31a or 31b, in which the acid has been generated as a result of the exposure process, as shown in FIG. 3E. In the example illustrated in FIG. 3E, the acid has been generated in the non-exposed portions 31b.

Finally, the resist film 31 is dry-developed (i.e., plasma-etched) using the silylated layer 37 as a hard mask, thereby forming a resist pattern 38 on the substrate 30 out of the non-exposed portions 31b of the resist film 31.

In the third embodiment, the pre-baking step is carried out in a vacuum, so a gas like $CO_2$ gas is given off from the resist film 31 in this pre-baking step. Accordingly, even if the resist film 31 is exposed to high-energy EUV radiation in a vacuum after that, the degassing phenomenon rarely occurs in that exposing step. That is to say, in this exposing step, the reactants, usually produced by the $CO_2$ gas, etc., emanated from the resist film 31 during the exposure, will not deposit themselves on the walls of the resultant resist pattern 38. This is because the gas has already been released in the previous step. Thus, those walls of the resist pattern 38 much less likely increase their roughness. Accordingly, when a film to be etched, which has been deposited on the substrate 30, is dry-etched and patterned, the walls of the patterned film will not increase their roughness, either.

In addition, the post-baking step is also performed in a vacuum. Accordingly, when the resist film 31 is dry-developed (i.e., plasma-etched) to define the resist pattern 38 or when a patterned film is formed by etching an original film with a plasma, the gas released from the resist film 31 will not mix with the plasma generated in the chamber. For that reason, the chemical composition of the plasma will not change during the plasma etching process. As a result, a good resist pattern can be defined and the walls of the patterned film will not increase their roughness.

Embodiment 4

Hereinafter, a resist pattern forming method according to a fourth embodiment of the present invention and an apparatus for fabricating a semiconductor device for use in the method of the fourth embodiment will be described with reference to FIGS. 1A through 1D and 4.

First, as shown in FIG. 1A, the surface of a semiconductor substrate 10 is coated with a normal (i.e., non-chemically-amplified) photoresist material in a first processing chamber 110 filled with the air at the atmospheric pressure, thereby forming a resist film 11 thereon.

Next, the substrate 10 is transported in line from the first processing chamber 110 to a second processing chamber 120 filled with a vacuum of about $1.0 \times 10^{-5}$ Pa. Then, in the second processing chamber 120, the resist film 11 is pre-baked by getting the substrate 10 heated by a heater 12 to about 90° C. for about 60 seconds, for example, as shown in FIG. 1B. In this manner, a solvent is vaporized from the resist film 11 and a gas (e.g., $CO_2$ gas) is given off from the resist film 11.

Subsequently, the substrate 10 is transported in line from the second processing chamber 120 to a third processing chamber 130 filled with a vacuum of about $1.0 \times 10^{-6}$ Pa. Then, in the third processing chamber 130, the resist film 11 is exposed to EUV radiation as shown in FIG. 1C. Specifically, the EUV radiation with a wavelength of around 13 nm, for example, is directed toward a reflective mask 13 and then reflected therefrom. Subsequently, the reflected part 14 of the EUV radiation is condensed by a reflection/demagnification optical system 15 to about ⅕, for example, and then allowed to be incident onto the resist film 11. As a result, the resist film 11 comes to have exposed and non-exposed portions 11a and 11b.

Thereafter, the substrate 10 is transported in line from the third processing chamber 130 to the first processing chamber 110. Then, in the first processing chamber 110, the resist film 11 is subjected to a wet developing process, thereby forming a resist pattern 16 on the substrate 10 out of the non-exposed portions 11b of the resist film 11 as shown in FIG. 1D.

In the fourth embodiment, the pre-baking step is carried out in a vacuum, so a gas like $CO_2$ gas is given off from the resist film 11 in this pre-baking step. Accordingly, even if the resist film 11 is exposed to high-energy EUV radiation in a vacuum after that, the degassing phenomenon rarely occurs in that exposing step.

It is not impossible to perform both the pre-baking and EUV exposure process steps in the same vacuum chamber. In that case, however, the reactants, produced by the $CO_2$ gas, etc., emanated from the resist film 11 in the pre-baking process step, might deposit themselves on the surface of the resist film 11, reflective mask 13 or optical system including the mirrors. If those reactants deposit themselves on the surface of the resist film 11, then the resist pattern 16 might be deformed. And if the reactants deposit themselves on the surface of the reflective mask 13 or mirrors, then the exposure dose of the resist film 11, or the amount of EUV radiation reflected off from the mask 13 or mirrors and then reaching the resist film 11, might decrease.

In contrast, according to the fourth embodiment, the pre-baking and exposing steps are performed in mutually different processing chambers. Accordingly, almost no reactants will deposit themselves on the surface of the resist film 11, reflective mask 13 or optical system including mirrors. Consequently, the resist pattern 16 will not be deformed or the EUV radiation exposure dose will not decrease.

Embodiment 5

Hereinafter, a resist pattern forming method according to a fifth embodiment of the present invention and an apparatus for fabricating a semiconductor device for use in the method of the fifth embodiment will be described with reference to FIGS. 2A through 2E and 5.

First, the surface of a semiconductor substrate 20 is coated with a chemically amplified photoresist material in a first processing chamber 210 filled with the air at the atmospheric pressure, thereby forming a resist film 21 thereon as shown in FIG. 2A.

Next, the substrate 20 is transported in line from the first processing chamber 210 to a second processing chamber 220 filled with a vacuum of about $1.0 \times 10^{-5}$ Pa. Then, in the second processing chamber 220, the resist film 21 is pre-baked by getting the substrate 20 heated by a heater 22 to about 110° C. for about 60 seconds, for example, as shown in FIG. 2B. In this manner, a solvent is vaporized from the resist film 21 and a gas (e.g., $CO_2$ gas) is given off from the resist film 21.

Thereafter, the substrate 20 is transported in line from the second processing chamber 220 to a third processing chamber 230 filled with a vacuum of about $1.0 \times 10^{-6}$ Pa. Then, in the third processing chamber 230, the resist film 21 is exposed to EUV radiation as shown in FIG. 2C. Specifically, the EUV radiation with a wavelength of around 13 nm, for example, is directed toward a reflective mask 23 and then reflected therefrom. Subsequently, the reflected part 24 of the EUV radiation is condensed by a reflection/demagnification optical system 25 to about ⅕, for example, and then allowed to be incident onto the resist film 21. As a result, the resist film 21 comes to have exposed and non-exposed portions 21a and 21b.

Thereafter, the substrate 20 is transported in line from the third processing chamber 230 to the second processing chamber 220. Then, in the second processing chamber 220, the resist film 21 is post-baked by getting the substrate 20 heated again by a heater 26 to 130° C. for 60 seconds, for example, as shown in FIG. 2D. In this manner, the acid, which has been generated in the exposed or non-exposed portions 21a or 21b of the resist film 21 as a result of the exposure process, further diffuses and the gas like the $CO_2$ gas further emanates from the resist film 21.

Subsequently, the substrate 20 is transported in line from the second processing chamber 220 to the first processing chamber 210. Then, in the first processing chamber 210, the resist film 21 is subjected to a wet developing process using a developer of TMAH, for example, thereby forming a resist pattern 27 on the substrate 20 out of the non-exposed portions 21b of the resist film 21 as shown in FIG. 2E.

In the fifth embodiment, the pre- and post-baking steps are carried out in a vacuum, so a gas like $CO_2$ gas is given off from the resist film 21 in these pre- and post-baking steps. Accordingly, even if the resist film 21 is exposed to high-energy EUV radiation in a vacuum after that, the degassing phenomenon rarely occurs in that exposing step. Moreover, the chemical composition of the plasma will not change while the film to be patterned is plasma-etched.

Also, the pre- and post-baking steps are performed in a chamber different from the chamber in which the exposing step is performed. In addition, a much smaller quantity of gas is released in the exposing step. Accordingly, almost no reactants will deposit themselves on the surface of the resist film 21, reflective mask 23 or optical system including mirrors. Consequently, the resist pattern 27 will not be deformed or the EUV radiation exposure dose will not decrease.

Embodiment 6

Hereinafter, a resist pattern forming method according to a sixth embodiment of the present invention and an apparatus for fabricating a semiconductor device for use in the method of the sixth embodiment will be described with reference to FIGS. 3A through 3F and 6.

First, the surface of a semiconductor substrate 30 is coated with a chemically amplified photoresist material in a first processing chamber 310 filled with the air at the atmospheric pressure, thereby forming a resist film 31 thereon as shown in FIG. 3A.

Next, the substrate 30 is transported in line from the first processing chamber 310 to a second processing chamber 320 filled with a vacuum of about $1.0 \times 10^{-5}$ Pa. Then, in the second processing chamber 320, the resist film 31 is pre-baked by getting the substrate 30 heated by a heater 32 to about 110° C. for about 60 seconds, for example, as shown in FIG. 3B. In this manner, a solvent is vaporized from the resist film 31 and a gas (e.g., $CO_2$ gas) is given off from the resist film 31.

Subsequently, the substrate 30 is transported in line from the second processing chamber 320 to a third processing chamber 330 filled with a vacuum of about $1.0 \times 10^{-6}$ Pa. Then, in the third processing chamber 330, the resist film 31 is exposed to EUV radiation as shown in FIG. 3C. Specifically, the EUV radiation with a wavelength of around 13 nm, for example, is directed toward a reflective mask 33 and then reflected therefrom. Subsequently, the reflected part 34 of the EUV radiation is condensed by a reflection/demagnification optical system 35 to about ⅕, for example, and then allowed to be incident onto the resist film 31. As a result, the resist film 31 comes to have exposed and non-exposed portions 31a and 31b.

Thereafter, the substrate 30 is transported in line from the third processing chamber 330 to the second processing chamber 320. Then, in the second processing chamber 320, the resist film 31 is post-baked by getting the substrate 30 heated again by a heater 36 to 130° C. for 60 seconds, for example, as shown in FIG. 3D. In this manner, the acid, which has been generated in the exposed or non-exposed portions 31a or 31b of the resist film 31 as a result of the exposure process, further diffuses and the gas like the $CO_2$ gas further emanates from the resist film 31.

Next, the substrate 30 is transported in line from the second processing chamber 320 to a fourth processing chamber 340 filled with a vacuum of about $1.0 \times 10^{-5}$ Pa. Then, in the fourth processing chamber 340, a silylating agent is supplied onto the surface of the resist film 31. In this manner, a silylated layer 37 is formed on the exposed or non-exposed portions 31a or 31b, in which the acid has been generated as a result of the exposure process, as shown in FIG. 3E.

Figure 3F:
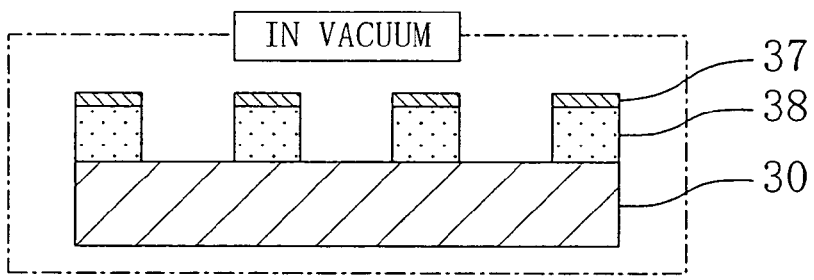
Figure 4:
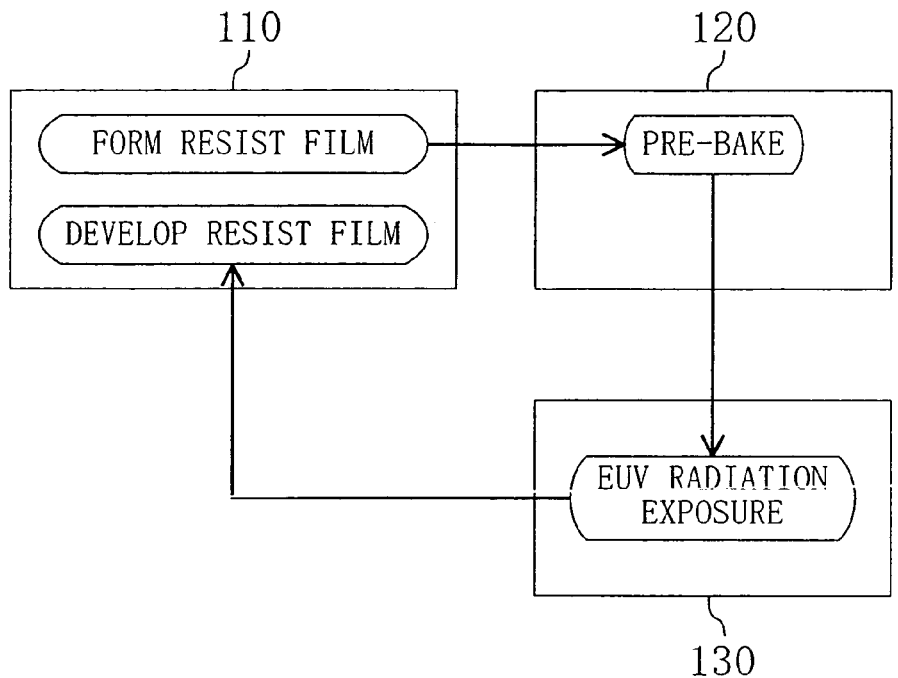
FIG. 4 is a block diagram illustrating an apparatus for fabricating a semiconductor device by carrying out a pattern forming method according to a fourth embodiment of the present invention.
Figure 5:
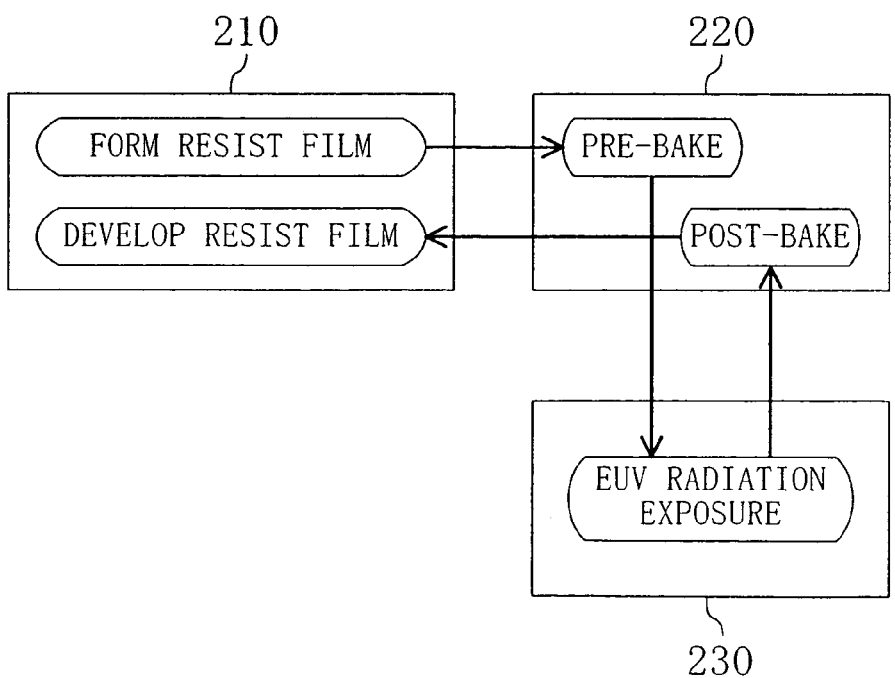
FIG. 5 is a block diagram illustrating an apparatus for fabricating a semiconductor device by carrying out a pattern forming method according to a fifth embodiment of the present invention.
Figure 6:
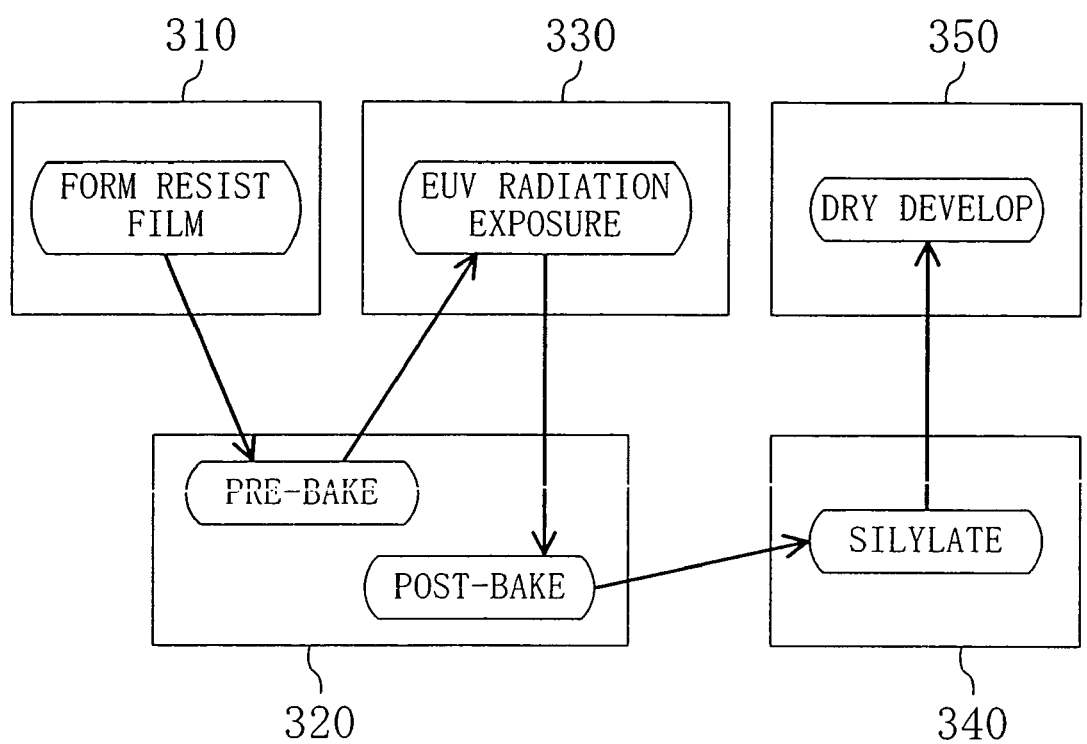
FIG. 6 is a block diagram illustrating an apparatus for fabricating a semiconductor device by carrying out a pattern forming method according to a sixth embodiment of the present invention.

Subsequently, the substrate 30 is transported in line from the fourth processing chamber 340 to a fifth processing chamber 350 filled with a vacuum of about $1.0 \times 10^{-6}$ Pa. Then, in the fifth processing chamber 350, the resist film 31 is dry-developed using the silylated layer 37 as a hard mask, thereby forming a resist pattern 38 on the substrate 30 out of the non-exposed portions 31b of the resist film 31 as shown in FIG. 3F.

In the sixth embodiment, the pre-baking step is carried out in a vacuum, so a gas like $CO_2$ gas is given off from the resist film 31 in this pre-baking step. Accordingly, even if the resist film 31 is exposed to high-energy EUV radiation in a vacuum after that, the degassing phenomenon rarely occurs in that exposing step.

In addition, the post-baking step is also performed in a vacuum. Accordingly, when the resist film 31 is dry-developed (i.e., plasma-etched) to define the resist pattern 38 or when a patterned film is formed by etching an original film with a plasma, the gas released from the resist film 31 will not mix with the plasma generated in the chamber. For that reason, the chemical composition of the plasma will not change during the plasma etching process. As a result, a good resist pattern can be defined and the walls of the patterned film will not increase their roughness.

Figure 7:
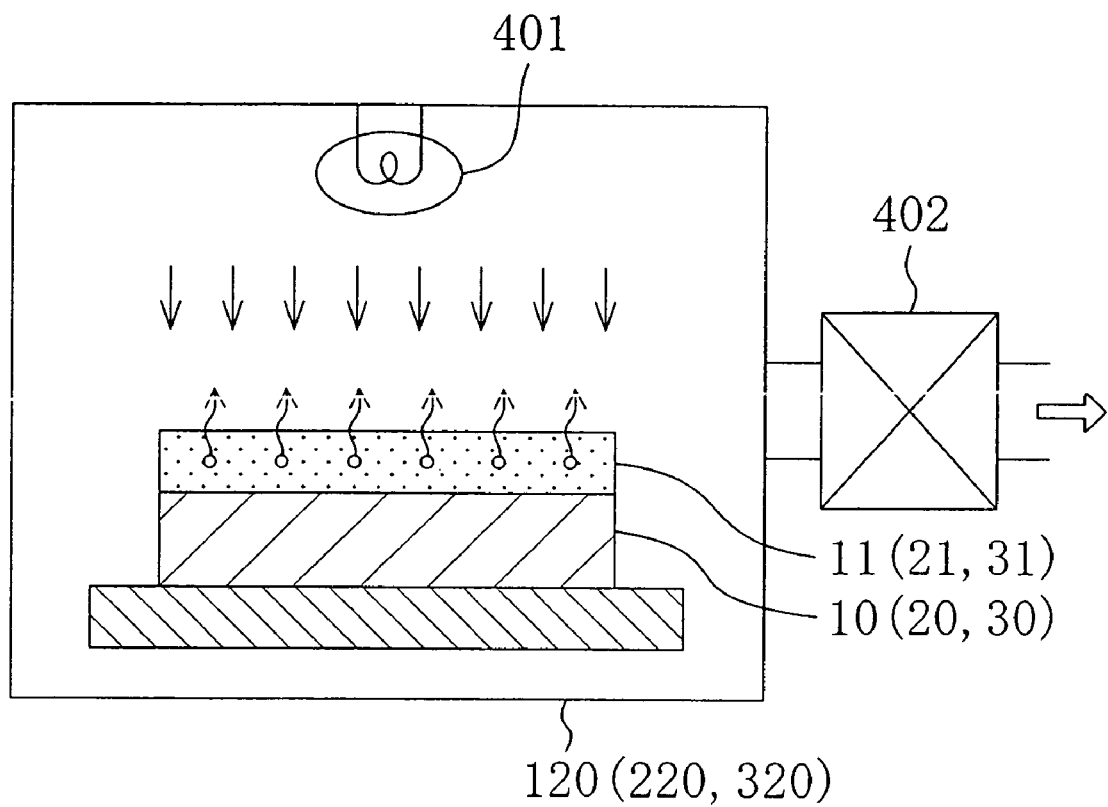
FIG. 7 is a cross-sectional view schematically illustrating the second processing chamber of an apparatus for fabricating a semiconductor device by carrying out the pattern forming method of the fourth, fifth or sixth embodiment.

FIG. 7 illustrates a cross-sectional structure for the second processing chamber 120, 220 or 320 of the fourth, fifth or sixth embodiment. As shown in FIG. 7, a lamp 401 for irradiating the resist film 11, 21 or 31 with radiation (e.g., visible light) with too long a wavelength to sensitize the resist film 11, 21 or 31 is disposed on the ceiling of the second processing chamber 120, 220 or 320. Accordingly, in the pre-baking process step, the resist film 11, 21 or 31 can be heated while being irradiated with the long-wavelength radiation. As a result, the resist film 11, 21 or 31 gives off an even greater quantity of gas.

As also shown in FIG. 7, the second processing chamber 120, 220 or 320 further includes means for exhausting the gas produced in the chamber 120, 220 or 320, e.g., a turbo pump 402 with a very large stroke volume. Accordingly, the gas (e.g., $CO_2$ gas), given off from the resist film 11, 21 or 31 in the pre-baking process step, can be forced out of the chamber 120, 220 or 320. Thus, it is possible to avoid an unwanted situation where the gas, released from the resist film 11, 21 or 31, re-produce the harmful reactants that easily deposit themselves on the surface of the resist film 11, 21 or 31, reflective mask 13, 23 or 33 or mirrors.

What is claimed is:

1. An apparatus for fabricating a semiconductor device, comprising:
    a first processing chamber for forming a resist film on a substrate;
    a second processing chamber, being kept in a vacuum state, for pre-baking the resist film; and
    a third processing chamber, being kept in a vacuum state, for exposing the pre-baked resist film to the extreme ultraviolet radiation.

2. The apparatus of claim 1, wherein the second processing chamber comprises means for irradiating the resist film with a type of radiation having too long a wavelength to sensitize the resist film.

3. The apparatus of claim 1, wherein the second processing chamber comprises means for exhausting a gas, emanated from the resist film, out of the second processing chamber.

4. An apparatus of claim 1, wherein the first processing chamber is also used for defining a resist pattern on the substrate by developing the resist film that has been exposed to extreme ultraviolet radiation.

5. An apparatus for fabricating a semiconductor device, comprising:
    a first processing chamber for forming a resist film on a substrate;
    a second processing chamber, being kept in a vacuum state, for pre- and post-baking the resist film before and after the resist film is exposed to the extreme ultraviolet radiation, respectively; and
    a third processing chamber, being kept in a vacuum state, for exposing the pre-baked resist film to the extreme ultraviolet radiation.

6. The apparatus of claim 5, wherein the second processing chamber comprises means for irradiating the resist film with a type of radiation having too long a wavelength to sensitize the resist film.

7. The apparatus of claim 5, wherein the second processing chamber comprises means for exhausting a gas, emanated from the resist film, out of the second processing chamber.

8. An apparatus of claim 5, wherein the first processing chamber is also used for defining a resist pattern on the substrate by developing the resist film that has been exposed to extreme ultraviolet radiation.

9. An apparatus for fabricating a semiconductor device, comprising:
    a first processing chamber for forming a resist film on a substrate;
    a second processing chamber, being kept in a vacuum state, for pre- and post-baking the resist film before and after the resist film is exposed to extreme ultraviolet radiation, respectively;
    a third processing chamber, being kept in a vacuum state, for exposing the pre-baked resist film to the extreme ultraviolet radiation;
    a fourth processing chamber for forming a silylated layer selectively on the surface of the post-baked resist film; and
    a fifth processing chamber for defining a resist pattern on the substrate by dry-developing the resist film, on which the silylated layer has been formed, using the silylated layer as a hard mask.

10. The apparatus of claim 9, wherein the second processing chamber comprises means for irradiating the resist film with a type of radiation having too long a wavelength to sensitize the resist film.

11. The apparatus of claim 9, wherein the second processing chamber comprises means for exhausting a gas, emanated from the resist film, out of the second processing chamber.

* * * * *